(12) United States Patent
Bill et al.

(10) Patent No.: US 6,285,594 B1
(45) Date of Patent: Sep. 4, 2001

(54) WORDLINE VOLTAGE PROTECTION

(75) Inventors: Colin S. Bill, Cupertino; Edward V. Bautista, Jr.; Santosh K. Yachareni, both of Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/523,816

(22) Filed: Mar. 13, 2000

Related U.S. Application Data
(60) Provisional application No. 60/184,926, filed on Feb. 25, 2000.

(51) Int. Cl.[7] .................................................... G11C 16/06
(52) U.S. Cl. ................................ 365/185.23; 365/185.22
(58) Field of Search ........................ 365/189.09, 185.22, 365/185.23, 230.06, 189.01, 185.01, 230.01

(56) References Cited

U.S. PATENT DOCUMENTS

| | | | |
|---|---|---|---|
| 5,428,568 | * 6/1995 | Kobayashi et al. | 365/185.24 |
| 5,654,920 | * 8/1997 | Watsuji et al. | 365/185.27 |
| 6,044,020 | * 3/2000 | Chung et al. | 365/185.23 |
| 6,101,126 | * 8/2000 | Chung et al. | 365/185.23 |

* cited by examiner

Primary Examiner—Hoai V. Ho
(74) Attorney, Agent, or Firm—Wagner, Murabito & Hao LLP (57) ABSTRACT

The present invention discloses methods and systems of wordline voltage protection to supply voltage to a plurality of wordlines in a memory device only during a read mode and a write mode. In the preferred embodiment, at least one wordline voltage protection circuit controls at least one decoder circuit that is activated to transfer voltage from at least one wordline voltage supply circuit to at least one wordline. The wordline voltage protection circuit activates the decoder circuit to transfer voltage to the wordline when the voltage is within a predetermined range and the memory device is performing one of a plurality of functions that include the write mode. The wordline voltage protection circuit also activates the decoder circuit to transfer voltage to the wordline when the memory device is performing one of a plurality of functions that include the read mode.

26 Claims, 4 Drawing Sheets

WORDLINE VOLTAGE PROTECTION

This application claims the benefit under 35 U.S.C. §119(e) of Provisional U.S. patent application Ser. No. 60/184,926, filed on Feb. 25, 2000.

FIELD OF THE INVENTION

The present invention relates generally to non-volatile memory devices and, more particularly, to methods and systems of preventing undesirable voltage on a plurality of wordlines in flash electrically erasable programmable read-only memory (EEPROM).

BACKGROUND OF THE INVENTION

A flash memory is a storage device that is capable of retaining stored information in the absence of continuous power. The information is stored in a plurality of flash transistors that are electrically connected and formed on a silicon substrate. A flash transistor is typically referred to as a cell and includes a source, a drain, a floating gate and a control gate. Flash memory devices are formed with rows and columns of flash transistors that form a flash transistor array of cells that are referred to as core memory cells. The flash transistor array is in the form of a matrix where typically the control gates of the core memory cells are electrically connected with a respective wordline such that a wordline decoder can direct a plurality of operational voltages to the wordlines. The drains of the core memory cells are typically electrically interconnected to form bitlines such that a bit line decoder directs a plurality of operational voltages to the bitlines. Generally, the sources of the core memory cells are electrically interconnected to form a common sourceline and are controlled by a sourceline controller.

To program a respective core memory cell in the flash memory, the control gate (wordline) and drain (bitline) of the cell to be programmed are raised to predetermined programming voltages and the source is grounded. When the predetermined programming voltages are removed, a negative charge on the floating gate is maintained. In contrast to the programming procedure, flash memory devices are typically bulk erased, so that all of the core memory cells on a predetermined number of bitlines and wordlines are simultaneously erased by applying predetermined voltages to the bitlines, the wordlines and the source line. Prior to the bulk erase, the core memory cells are pre-programmed since all cells must be programmed prior to erase to avoid over erasure as known in the art.

In order to read a given cell, a voltage called the threshold voltage of the cell is measured to determine if the cell is in a charged (programmed) or an uncharged (un-programmed) state. Core memory cells are read by applying a predetermined voltage to the wordline and the bitline, grounding the source line and then sensing the current on the bitline. If the core memory cell is programmed, the threshold voltage will be relatively high and the bitline current will be zero, or at least relatively low, when the predetermined voltage is applied between the control gate and the drain of the core memory cell. If the core memory cell is not programmed, the threshold voltage will be relatively low and the bitline current will be relatively high when the predetermined voltage is applied.

Typically, programming and erasing cells includes verification to confirm the threshold voltage is at the correct magnitude for the desired state of the cells. Verification is accomplished by methods known in the art as a program verify and an erase verify. The program verify and erase verify involve reading the state of cells previously subjected to the predetermined program and erase voltages and taking corrective actions that include further programming and erasing if the magnitude of the threshold voltage is incorrect.

The threshold voltage is typically determined from the bitline current of the core memory cells during the program verify and erase verify by reading and comparing the bitline current of the core memory cells with a reference current in a sensing circuit. In general, if the core memory cell conducts a current greater than or equal to the reference current, it is un-programmed and if the core memory cell conducts a current less than the reference current, it is programmed. The reference current is generated from a group of reference memory cells in the sensing circuit that are subjected to the same wordline and bitline voltages as the core memory cells targeted for programming or erasing.

In prior art flash memory utilizing 0.25 micron process technology, the wordlines of the core memory cells and the reference memory cells are typically supplied voltage during embedded modes when the flash memory is not in auto power-down mode. As known in the art, the auto power-down mode is a "sleep" mode that removes the supply voltage (Vcc) from the flash memory during periods of inactivity to conserve power. When not in the auto power-down mode, prior art flash memory with direct current (dc) sensing typically has voltage supplied to the wordlines during embedded modes even when a function that includes the programming, erasing or reading of the cells is not occurring. Prior art flash memory with alternate current (ac) sensing may also have voltage supplied to the wordlines during embedded modes for an indefinite period.

A known problem can arise when the magnitude and/or duration of voltage supplied to the wordlines when no function is occurring is such that the cells electrically connected with the wordlines are disturbed. As known in the art, when the cells electrically connected with the wordlines are disturbed, single bit charge gain can occur. Single bit charge gain causes the threshold voltage of the cells to change thereby causing errors and reliability problems when the cells are read. In addition, another known problem involves the power consumed by the wordline decoder when voltage is supplied to the wordlines while no function is occurring.

To that end, a need exists for methods and systems capable of allowing voltage to be applied to the wordlines only when the cells on the wordlines are being read, programmed or erased.

SUMMARY OF THE INVENTION

The present invention discloses systems and methods of providing a predetermined voltage to at least one wordline in a memory device that in the preferred embodiment is a flash memory. In the preferred flash memory, voltage is supplied to the wordlines only when core memory cells on the selected wordlines are being read, programmed or erased. As such, the core memory cells will not be disturbed and power consumption by the flash memory is minimized during operation. As known in the art, disturbance of the core memory cells can cause errors and reliability problems when the core memory cells are read during use to retrieve data stored in the flash memory.

The preferred flash memory includes at least one wordline voltage supply circuit, at least one decoder circuit, a wordline voltage protection circuit and at least one wordline. In the preferred embodiment of the invention, the wordline voltage supply circuits are electrically connected with the decoder circuits and the wordline voltage protection circuit. The decoder circuits are also electrically connected with the wordline voltage protection circuit and the wordlines.

During operation of the preferred flash memory, the wordline voltage supply circuits generate a predetermined voltage for the wordlines depending upon which designated function is being performed. The voltages that may be supplied by the wordline voltage supply circuits during operation include a supply voltage (Vcc), a predetermined erase verify voltage, a predetermined program verify voltage and a predetermined program voltage. The voltage generated by the wordline voltage supply circuits is supplied to the decoder circuits. The decoder circuits comprise a plurality of wordline decoders that are only enabled when the wordline voltage protection circuits activate the decoder circuits. Once the decoder circuits are activated, the wordlines are decoded and the voltage supplied by the wordline voltage supply circuits is transferred to the wordlines by the selected decoders.

The wordline voltage protection circuit activates the decoder circuits during a read or a write mode in the flash memory. Those skilled in the art would recognize that the core memory cells can verified or programmed and erased during the write mode and read during the read mode. The wordline voltage protection circuit includes a voltage verification circuit and an initialization logic circuit and is provided control outputs from a state machine to determine when the decoder circuits should be activated.

During operation of the preferred flash memory, the decoder circuits are activated by the wordline voltage protection circuit when voltage supplied by the wordline voltage supply circuit is within a predetermined voltage range during performance of one of a plurality of functions that include the write mode. Alternatively, the decoder circuits are activated by the wordline voltage protection circuit during performance of one of a plurality of functions that include the read mode. The plurality of functions are performed in an embedded or a manual mode in the flash memory and include read, erase, erase verify, program and program verify. Those skilled in the art would recognize that other functions are possible and the functions set forth should not be construed as a limitation on the present invention.

At the conclusion of the read or write mode, the wordline voltage protection circuit deactivates the decoder circuits. Since the wordline voltage protection circuit only allows voltage to be transferred to the wordlines during the read or write modes, the wordlines are protected from undesirable exposure to voltage from the wordline voltage supply circuits. In addition, the wordline decoders do not consume power when no voltage is present on the wordlines.

Another preferred embodiment of the present invention discloses a wordline voltage protection system for a plurality of wordlines in a memory device. The preferred wordline voltage protection system includes at least one wordline voltage supply circuit, at least one decoder circuit and at least one voltage protection circuit. The wordline voltage supply circuit supplies a predetermined voltage for the wordlines. The decoder circuit transfers the predetermined voltage supplied by the wordline voltage supply circuit to the wordlines only when activated by the wordline voltage protection circuit during the write mode or the read mode.

In another preferred embodiment of the present invention, the decoder circuits are electrically connected with a plurality of reference wordlines that are electrically connected with a plurality of reference memory cells. Similar to the previous preferred embodiments, the voltage protection circuit activates the decoder circuit when the predetermined voltage is supplied from the wordline voltage supply circuits and one of a plurality of functions is performed that includes reading the reference memory cells. In this preferred embodiment, the plurality of functions include erase verify and program verify of the core memory cells set forth in the previous preferred embodiment. Those skilled in the art would again recognize that other functions are possible and the functions set forth should not be construed as a limitation on the present invention.

These and other features and advantages of the invention will become apparent upon consideration of the following detailed description of the presently preferred embodiments of the invention, viewed in conjunction with the appended drawings.

DETAILED DESCRIPTION OF THE PRESENTLY PREFERRED EMBODIMENTS OF THE INVENTION

The exemplary embodiments of the invention are set forth below with reference to specific configurations, and those skilled in the art would recognize that various changes and modifications could be made to the specific configurations while remaining within the scope of the claims. The invention may be used with any type of memory device, however, the preferred embodiment of the invention is designed for flash memory.

All electrical parameters are given by example only and the present invention can be modified for use with various memory devices using other electrical parameters. For example, in the preferred embodiment of the invention set forth below, a supply voltage (Vcc) is 5 V. Those skilled in the art would recognize that the supply voltage (Vcc) could alternatively be 3.3 V, 1.8 V or some other supply voltage.

Figure 1:
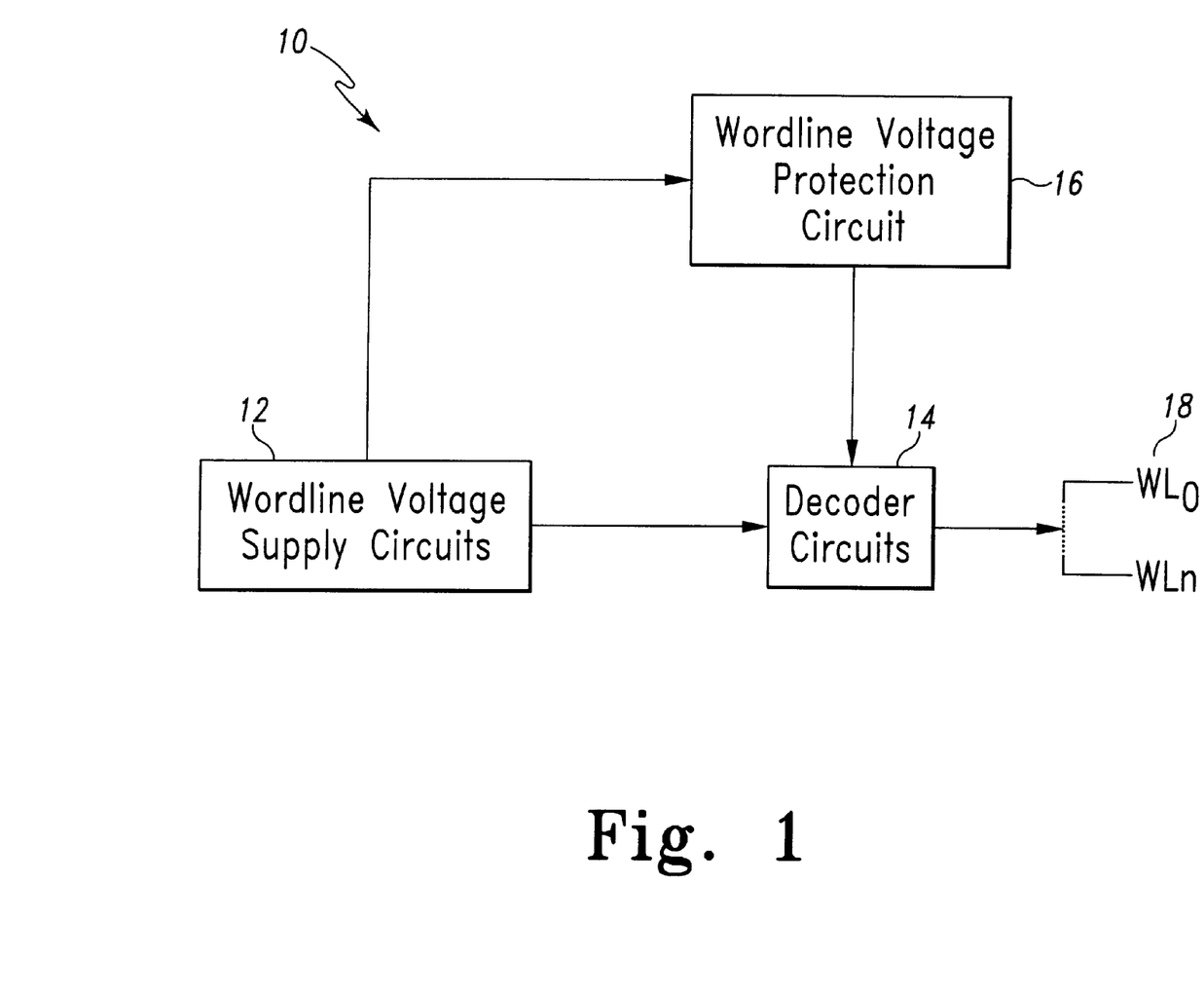
FIG. 1 is a block diagram of a portion of a preferred flash memory incorporating the present methods and systems of wordline voltage protection.

FIG. 1 illustrates a block diagram of a portion of a preferred flash memory 10 that incorporates an embodiment of the present invention. The flash memory 10 includes a plurality of wordline voltage supply circuits 12, a plurality of decoder circuits 14, a wordline voltage protection circuit 16 and a plurality of wordlines 18. In the preferred embodiment of the invention, the wordline voltage supply circuits 12 are electrically connected with the decoder circuits 14 and the wordline voltage protection circuit 16. The decoder circuits 14 are electrically connected with the wordline voltage protection circuit 16 and the wordlines 18. In the preferred embodiment the wordline voltage protection circuit 16 protects the wordlines 18 from seeing unwanted voltages during operation of the flash memory 10.

During operation of the preferred flash memory 10, when the decoder circuits 14 are activated by the wordline voltage protection circuit 16, the decoder circuits 14 transfer voltage supplied by the wordline voltage supply circuits 12 to the wordlines 18. The wordline voltage protection circuit 16 activates the decoder circuits 14 during a read or a write mode in the flash memory 10. Those skilled in the art would recognize that core memory cells (not shown) that are electrically connected with the wordlines 18 can be read, programmed or erased during the write mode and read during the read mode of the preferred flash memory 10.

During the write mode, the wordline voltage protection circuit 16 verifies that the voltage provided by the wordline voltage supply circuits 12 is within a predetermined voltage range prior to activating the decoder circuits 14. At the conclusion of the read or write mode, the wordline voltage protection circuit 16 deactivates the decoder circuits 14. Since the wordline voltage protection circuit 16 only allows voltage to be transferred to the wordlines 18 during the read and write modes, the wordlines 18 are protected from undesirable exposure to voltage from the wordline voltage supply circuits 12 and power is conserved.

In the present invention, the voltages supplied by the wordline voltage supply circuits 12 include: a supply voltage (Vcc), which ranges from about 4.5 V–5.5 V ; a predetermined erase verify voltage that is typically about 3.7 V; a predetermined program verify voltage that is typically about 5.5 V ; and a predetermined program voltage that ranges from about 8.3 V–9.3 V. The supply voltage (Vcc) is supplied to the decoder circuits 14 during the read mode and when the write mode is not occurring. The respective predetermined erase verify voltage, program verify voltage and program voltage is supplied during the write mode to erase verify, program verify and program the core memory cells respectively.

In the preferred embodiment, the supply voltage (Vcc) is generated by an external power supply, the predetermined erase verify voltage is the supply voltage (Vcc) reduced by about eighty percent and the predetermined program and program verify voltages are generated using the supply voltage (Vcc) and a charge pump. As known in the art, charge pumps receive a magnitude of input voltage that is channeled through a series of capacitive stages to increase the magnitude of voltage generated at the output of the charge pump. Those skilled in the art would recognize that there are many variations of the wordline voltage supply circuits 12 that are capable of supplying voltage. As such, a detailed description of the circuit configuration and operation of the wordline voltage supply circuits 12 is not necessary for purposes of the present invention.

The preferred decoder circuits 14 comprise a plurality of wordline decoders (not shown) that decode the wordlines 18 to allow the transfer of voltages that are supplied by the wordline voltage supply circuits 12 to the wordlines 18. As known in the art, a fundamental component of any memory device are decoder circuits and a variety of decoder circuits exist that could be used to make up the decoder circuits 14. In general, decoder circuits output an electric signal if all of the bits of an address input correspond to a predetermined set of values. For purposes of the present invention, it is only necessary for those skilled in the art to understand that the decoder circuits 14 are disabled from decoding wordlines 18 until an enabling signal is received from the wordline voltage protection circuit 16.

The wordline voltage protection circuit 16 activates the decoder circuits 14 when a function that includes the read mode or the write mode is performed within the flash memory 10. The functions are initiated by commands in a command sequence that are received by the flash memory 10. Those skilled in the art would understand that command sequences are initiated by a user to direct the operation of the flash memory 10 and that each command sequence typically includes a number of commands initiated by the user. In the preferred embodiment of the present invention, the functions include read, erase, erase verify, program and program verify of the core memory cells. Those skilled in the art would understand that other functions are possible and the functions set forth should not be construed as a limitation on the present invention.

Functions that include the read and write modes can occur in an embedded mode or a manual mode within the flash memory 10 and require voltage supplied from the wordline voltage supply circuits 12 on the wordlines 18. As known in the art, embedded mode is a mode in the flash memory 10 where functions occur in an automated fashion. In the embedded or manual mode, the wordline voltage protection circuit 16 activates the decoder circuits 14 to transfer voltage to the wordlines 18 only when a function that includes the read or write mode is performed. Upon completion of the function that includes the read or write mode, the decoder circuits 14 are disabled by the wordline voltage protection circuit 16.

In the preferred embodiment of the present invention, ac sensing is used to sense current flow through the core memory cells when the core memory cells are read. When ac sensing is used, the flash memory operates such that when a function is complete and additional functions have not been initiated by another command, the supply voltage (Vcc) is supplied by the wordline voltage supply circuits 12 to the decoder circuits 14. In another preferred embodiment, dc sensing is used such that the supply voltage (Vcc) is supplied by the wordline voltage supply circuits 12 to the decoder circuits 14 except when other voltage magnitudes are supplied by the wordline voltage supply circuits 12. The wordlines 18 are not exposed to the supply voltage (Vcc) during these conditions since the decoder circuits 14 are only activated by the wordline voltage protection circuit 16 when a function that includes the read or write mode is initiated by commands within the command sequence. The decoder circuits 14 pass the voltage that is present from the wordline voltage supply circuits 12 to the wordlines 18 only when decoded during operation.

Figure 2:
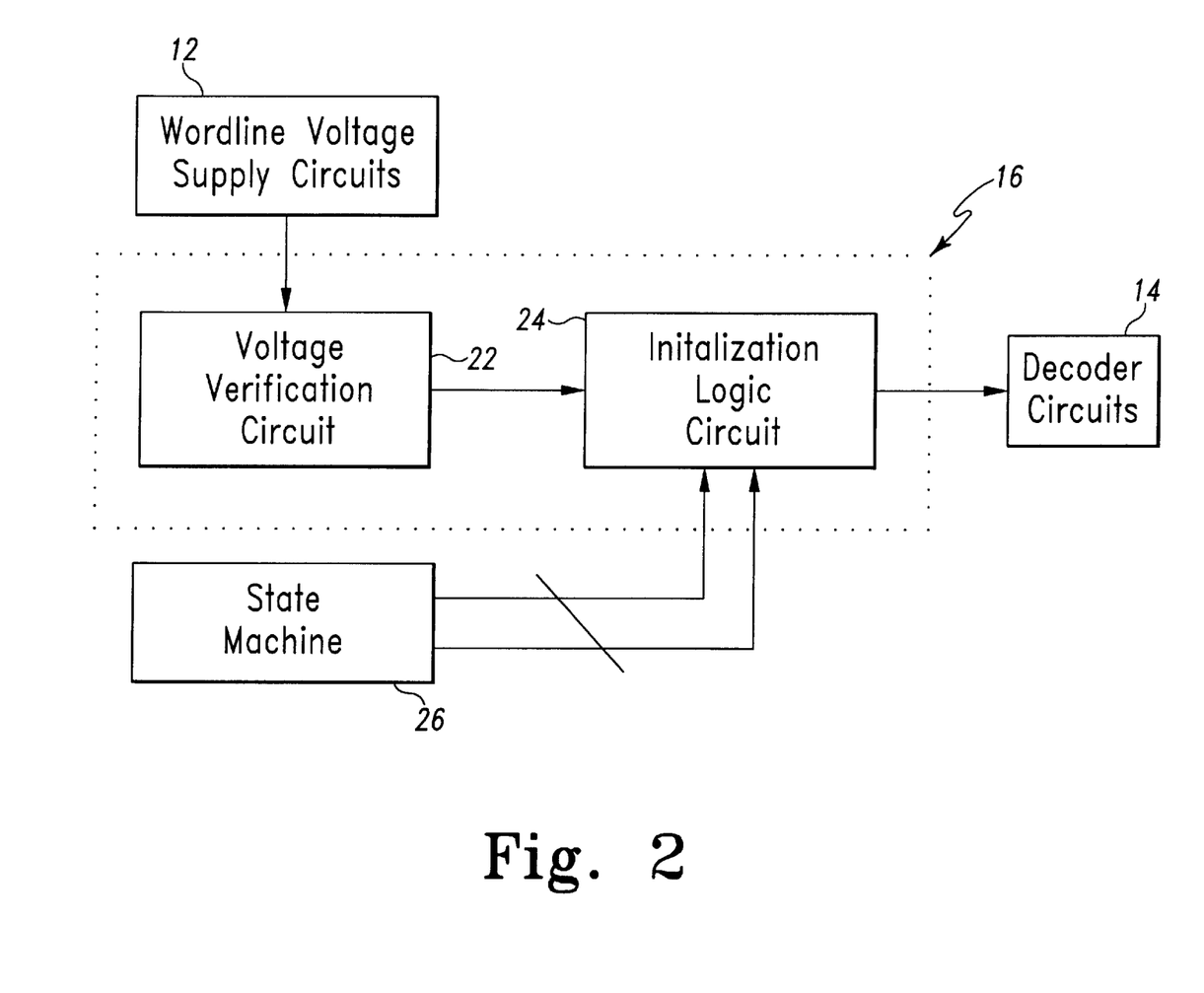
FIG. 2 is an expanded block diagram of the preferred wordline voltage protection circuit of the present invention.

FIG. 2 illustrates an expanded block diagram of the preferred wordline voltage protection circuit 16. The preferred wordline voltage protection circuit 16 includes a voltage verification circuit 22 and an initialization logic circuit 24. As illustrated in FIG. 2, the voltage verification circuit 22 is electrically connected with the initialization logic circuit 24 and the wordline voltage supply circuits 12. The initialization logic circuit 24 is electrically connected with the decoder circuits 14 such that predetermined electric signals are generated as an output from the initialization logic circuit 24 to the decoder circuits 14.

In the preferred embodiment, a state machine 26 provides control inputs in the form of predetermined electric signals to the initialization logic circuit 24. As known in the art, the state machine 26 is used to control the overall operation of the flash memory 10 in response to instruction sets that are received by the state machine 26. For purposes of the present invention, it is only necessary for those skilled in the art to understand that the state machine 26 responds to instruction sets when a command within a command sequence is initiated. The instruction sets direct the state machine 26 to send a plurality of predetermined electric signals to the initialization logic circuit 24 that identify the mode of operation and the function activated by the command in the command sequence. The state machine 26 may also be connected with various other circuitry that ultimately generate the control signals that are sent to the initialization logic circuit 24. The electrical configuration of the state machine 26 is beyond the scope of the present invention and a detailed discussion of the state machine 26 is therefore unnecessary.

The voltage verification circuit 22 compares the voltage supplied by the wordline voltage supply circuits 12 with a reference voltage. In the preferred embodiment of the present invention, when the predetermined voltage is within the predetermined voltage range of approximately 3.65 V–3.75 V for erase verify, 5.45V–5.55 V for program verify and 8.4 V–8.55 V for program, the voltage verification circuit 22 generates a predetermined electric signal that is directed to the initialization logic circuit 24. Those skilled in the art would recognize that the predetermined voltage ranges depend on the voltage needed to erase verify, program verify and program the core memory cells electrically connected with the wordlines 18. In addition, those skilled in the art would understand that a variety of circuits can be used for voltage comparison and a detailed discussion of the voltage verification circuit 22 of the preferred embodiment is therefore unnecessary.

Figure 3:
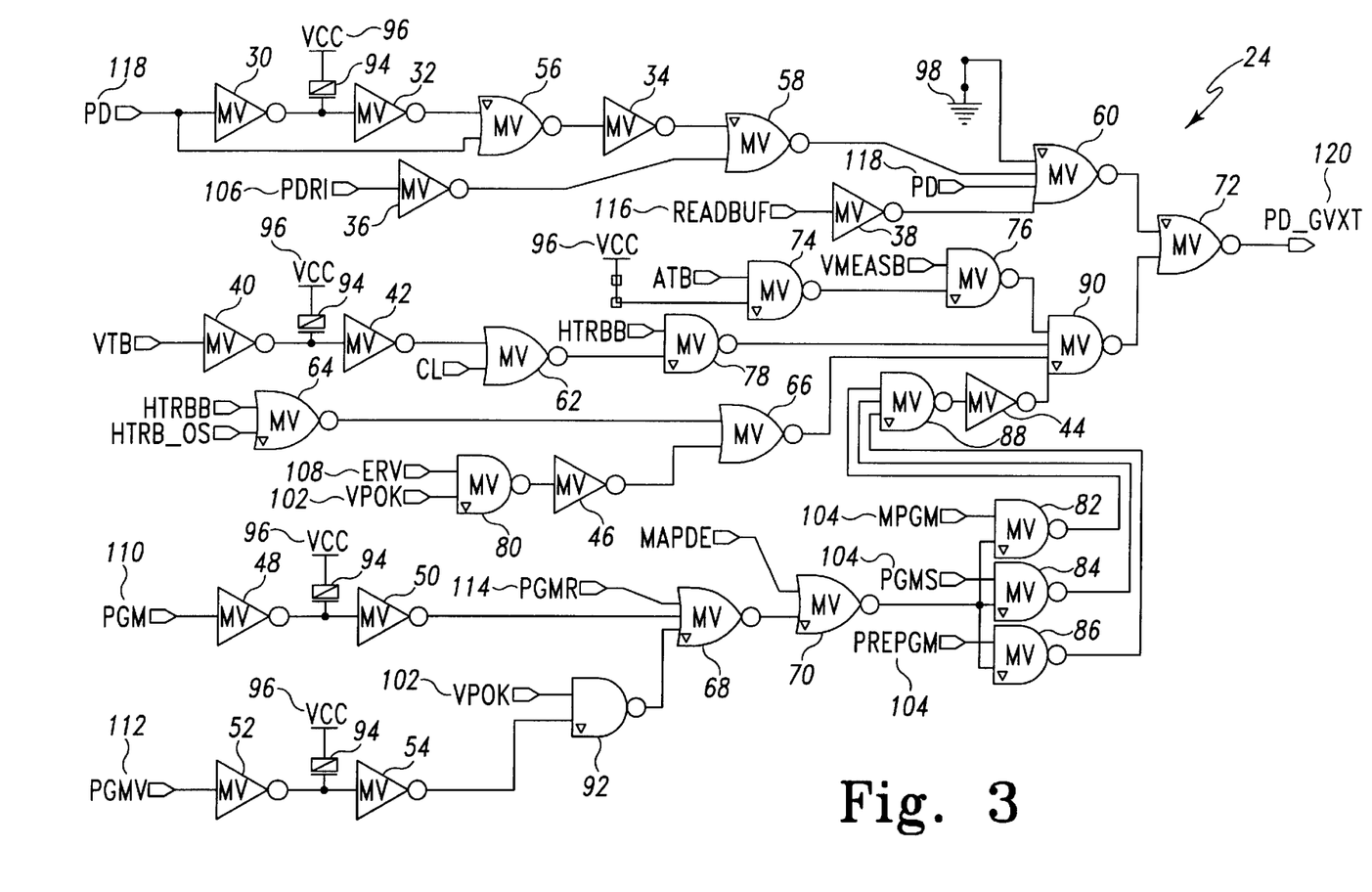
FIG. 3 is a circuit schematic of a preferred initialization logic circuit of the present invention.

FIG. 3 illustrates a circuit schematic representing the preferred initialization logic circuit 24. The preferred initialization logic circuit 24 includes a plurality of inverters 30–54, a plurality of NOR gates 56–72, a plurality of NAND gates 74–90, an AND gate 92 and a plurality of capacitors 94 electrically connected as illustrated in FIG. 3. The initialization logic circuit 24 is also electrically connected with supply voltage (Vcc) 96 and a ground connection 98 as illustrated.

As previously set forth, the initialization logic circuit 24 receives predetermined electric signals provided by the voltage verification circuit 22 and the state machine 26. The predetermined electric signals from the voltage verification circuit 22 are provided on a voltage ok line (VPOK) 102. The predetermined electric signals from the state machine 26 are provided on a plurality of program mode lines (GM, PGMS and PREPGM) 104, a read line (PDRI) 106, an erase verify line (ERV) 108, a program line (PGM) 110, a program verify line (PGMV) 112, a read buffer line (READBUF) 116 and a power down line (PD) 118. The predetermined electric signals from the voltage verification circuit 22 and the state machine 26 activate the initialization logic circuit 24 to generate a non-conducting electric signal on a voltage transfer line (PD_GVXT) 120 to activate the decoder circuits 14. Those skilled in the art would recognize that the propagation of logic through the preferred initialization logic circuit 24 could easily be represented in a logic table if desired.

The electric signals generated by the state machine 26 on the program mode lines (MPGM, PGMS and PREPGM) 104, the read buffer line (READBUF) 116 and the power down line (PD) 118 represent modes of operation of the flash memory 10. The power down line (PD) 118 is activated except during a "sleep" mode that occurs when the flash memory 10 is inactive for a predetermined period of time as known in the art. Those skilled in the art would recognize that the program mode lines (MPGM, PGMS and PREPGM) 104 and the read buffer line (READBUF) 116 are modes of operation used to configure, test and operate the flash memory 10. FIG. 3 also includes a plurality of lines not discussed herein that pertain to other modes of operation of the flash memory 10. Those skilled in the art would recognize that some modes of operation require enabling or disabling of the decoder circuits 14 without regard to the read, erase, erase verify, program and program verify functions and that these modes of operation are outside the scope of the present invention.

To initiate the write mode, when the erase, erase verify, program or program verify function is performed, the state machine 26 generates an electric signal that is conducting on one of the program mode lines (MPGM, PGMS and PREPGRM) 104 and the erase verify line (ERV) 108, the program line (PGM) 110 or the program verify line (PGMV) 112. In addition, the voltage verification circuit 22 begins conducting an electric signal on the voltage ok line (VPOK) 102 when the voltage is within the predetermined range for the function performed. Those skilled in the art would recognize that the predetermined program voltage is supplied during the program and erase function since the memory cells are programmed prior to erase. The read mode occurs when a mode of operation includes the read function and the state machine 26 generates an electric signal that is conducting on the read buffer line (READBUF) 116 and non-conducting electric signal on the read line (PDRI) 106.

At the conclusion of functions that include the write mode, the state machine 26 generates a non-conducting electric signal on the respective erase verify line (ERV) 108, program line (PGM) 110 or program verify line (PGMV) 112 to disable the decoder circuits 14. When the function that includes the read mode is concluded, the state machine 26 generates a conducting electric signal on the read line (PDRI) 106 to disable the decoder circuits 14. Those skilled in the art would recognize that the modes of operation and the functions set forth in the preferred embodiment are illustrative only and should not be construed as a limitation on the present invention.

Figure 4:
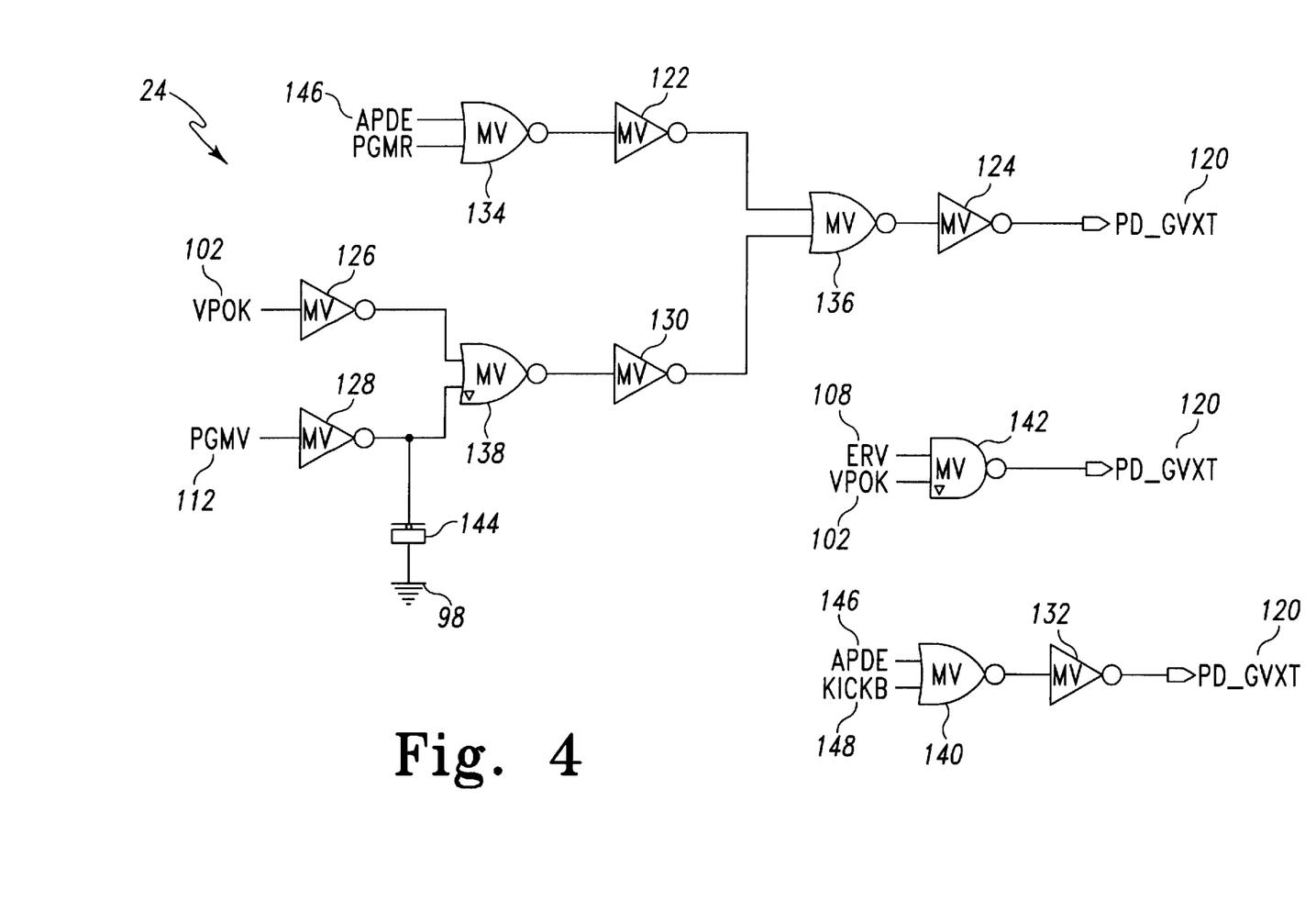
FIG. 4 is a circuit schematic of another preferred initialization logic circuit of the present invention.

FIG. 4 is a circuit schematic of another preferred embodiment of the initialization logic circuit 24. The preferred initialization logic circuit 24 includes a plurality of inverters 122–132, a plurality of NOR gates 134–140, a NAND gate 142 and a capacitor 144 electrically connected as illustrated in FIG. 4. The initialization logic circuit 24 is also electrically connected with the ground connection 98 as illustrated.

Although not illustrated, in this preferred embodiment of the present invention, the decoder circuits 14 are electrically connected with a plurality of reference wordlines 18 and the reference wordlines 18 are electrically connected with a plurality of reference memory cells. Those skilled in the art would recognize that wordlines describe the wordlines 18 of the previous preferred embodiment as well as the reference wordlines 18. Similar to the previous preferred embodiment set forth in FIG. 1, the wordline voltage protection circuit 16 activates the decoder circuits 14 when voltage in the predetermined voltage range is supplied from the wordline voltage supply circuits 12 and a respective function is performed that includes reading the reference memory cells.

In this preferred embodiment, the state machine 26 generates an electric signal on the program verify line (PGMV) 112 and the erase verify line (ERV) 108 to indicate the respective program verify and erase verify functions are occurring on the core memory cells of the previously set forth preferred embodiment. Since these functions include the write mode, the voltage verification circuit 22 generates an electric signal on the voltage ok line (VPOK) 102. Those skilled in the art would again recognize that other functions are possible and the functions set forth should not be construed as a limitation of the present invention.

As illustrated in the preferred embodiment of FIG. 4, there are multiple voltage transfer lines (PD_GVXT) 120 to activate the decoder circuits 14 that are used during the program verify and erase verify functions. The decoder circuits 14 transfer the predetermined erase verify voltage and the predetermined program verify voltage, respectively to the reference wordlines 18. Due to the operation of the preferred reference memory cells, read mode protection is achieved by the electric signals on the auto program disturb erase line (APDE) 146 and the kick boost line (KICKB) 148 that do not allow the supply voltage (Vcc) to remain on the reference wordlines 18 while the read mode is not occurring. Similar to the previous preferred embodiment, this preferred initialization logic circuit 24 protects the preferred reference memory cells from undesirable exposure to voltage from the wordline voltage supply circuits 12. FIG. 4 also illustrates a plurality of lines not discussed herein that pertain to other modes of operation that are outside the scope of the present invention.

During operation of the preferred flash memory 10, the user initiates a first command in a command sequence. The command is sent as an instruction set to the state machine 26. The state machine 26 generates predetermined electric signals that are provided to the initialization logic circuit 24 and indicate the function to be performed.

As previously set forth, voltage supplied by the wordline voltage supply circuits 12 to support the function being performed will not be transferred to the reference wordlines 18 until the decoder circuits 14 are activate by the wordline protection circuit 16. For functions that include the write mode, the initialization logic circuit 24 will activate the decoder circuits 14 with a predetermined electric signal on the voltage transfer line (PD_GVXT) 120 only when voltage within the predetermined range for that function is supplied. If the function includes the read mode, the decoder circuits 14 are activated by the initialization logic circuit 24 when the state machine 26 indicates the function includes the read mode. In known uses of dc sensing, voltage is transferred to the wordlines 18 at all times the flash memory 10 is not in a power down mode.

If a user initiates the first command in a command sequence but does not initiate the remaining commands in the command sequence, the state machine 26 will provide predetermined electric signals to the initialization logic circuit 24 to indicate when the function initiated by the first command is complete. The initialization logic circuit 24 will subsequently deactivate the decoder circuits 14 such that the decoder circuits 14 no longer transfer voltage from the wordline voltage supply circuits 12 to the wordlines 18. In known uses of ac sensing, when the commands in a command sequence are suspended, the wordline voltage supply circuits 12 continue to supply voltage to the wordlines 18 while waiting for the next command in the command sequence to be initiated.

In the preferred embodiment of the present invention, 0.25 micron process technology is utilized, the supply voltage (Vcc) is about 5 V and direct current sensing or alternating current sensing can be used to sense the data stored in the memory cells on the wordlines 18. Since voltage from the voltage supply circuits 12 is not transferred to the wordlines 18 except during the read and write mode, the memory cells are not disturbed by exposure to voltage such as the supply voltage (Vcc) that could cause single bit charge gain. As known in the art, single bit charge gain can cause reliability problems when the memory cells are read. In addition, those skilled in the art recognize that supply voltages vary and may cause single bit charge gain if the wordlines 18 are exposed.

The wordlines 18 are also protected from undesirable voltage during the erase, erase verify, program verify and program functions since the wordlines 18 are only exposed to voltage in the predetermined voltage ranges. In addition, as known in the art, the wordline decoders 14 may consume power when voltage is applied to the wordlines 18. Since voltage is not maintained on the wordlines 18 except during the read or write mode, power consumption by the wordline decoders 14 is minimized. In the preferred embodiments of the present invention, the memory cells remain undisturbed, no single bit charge gain occurs, the threshold voltage is not changed therefore errors or reliability problems are unlikely when the memory cells are read.

While the invention has been described in its currently best known modes of operation and embodiments, other modes and embodiments of the invention will be apparent to those skilled in the art. It is the following claims, including all equivalents that are intended to define the spirit and scope of the invention.

What is claimed is:

1. A method of controlling voltage applied to wordlines in a memory device, the method comprising:
   a) initiating a function comprising at least one of a read, an erase and a program;
   b) generating a voltage for the wordlines; and
   c) transferring the voltage to the wordlines only while the function is occurring and the voltage is verified to be within a predetermined range, the predetermined range determined based on the function.

2. The method of claim 1, wherein a) comprises initiating a command sequence.

3. The method of claim 2, wherein the command sequence is manually initiated.

4. The method of claim 1, wherein a) further comprises initiating at least one of an erase verify and a program verify.

5. The method of claim 1, wherein b) comprises generating the voltage based on the function initiated.

6. The method of claim 1, wherein b) comprises supplying the voltage to a decoder circuit.

7. The method of claim 1, wherein c) comprises:
   enabling a decoder circuit to transfer the voltage; and
   disabling the decoder circuit when the function is concluded.

8. The method of claim 1, further comprising continuing to generate the voltage when the function is complete.

9. A method of selectively applying voltage to wordlines in a memory device, the method comprising:
   a) performing one of a read mode and a write mode;
   b) enabling the transfer of voltage to the wordlines during one of the read mode and the write mode based on occurrence of a function and verification that the voltage is within a predetermined range for the function occurring, the function comprising at least one of a read, an erase, and a program; and
   c) disabling the transfer of voltage in the absence of one of the read mode and the write mode.

10. The method of claim 9, wherein a) comprises generating voltage as a function of one of the read mode and the write mode.

11. The method of claim 9, wherein a) comprises initiating a function that comprises one of the read mode and the write mode.

12. The method of claim 9, wherein a) comprises manually initiating a command sequence.

13. The method of claim 9, wherein performing the read mode comprises reading a plurality of core memory cells on the wordlines.

14. The method of claim 9, wherein performing the read mode comprises reading a plurality of reference memory cells on the wordlines.

15. The method of claim 9, wherein the function further comprises at least one of an erase verify and a program verify.

16. The method of claim 15, wherein performing the write mode comprises at least one of erasing, erase verifying, programming and program verifying a plurality of core memory cells on the wordlines.

17. A system for controlling application of voltage to wordlines in a memory device, the system comprising:
- a decoder circuit operable to transfer a voltage to the wordlines; and
- a wordline voltage protection circuit electrically connected with the decoder circuit, the wordline voltage protection circuit operable to enable the decoder circuit to transfer the voltage only when a function is occurring, the function comprising one of a read, an erase and a program,
- the wordline voltage protection circuit comprising a voltage verification circuit operable to verify the voltage is within a predetermined range, the predetermined range determined based on the function occurring.

18. The system of claim 17, further comprising a wordline voltage supply circuit electrically connected with the wordline voltage protection circuit and the decoder circuit, the wordline voltage supply circuit operable to supply the voltage to the decoder circuit.

19. The system of claim 17, further comprising a state machine electrically connected with the decoder circuit and the wordline voltage protection circuit, the state machine responsive to a command sequence that initiates the function, the state machine operable to provide signals indicative of the function to the wordline voltage protection circuit.

20. The system of claim 17, wherein the wordline voltage protection circuit further comprises an initialization logic circuit, the initialization logic circuit operable to enable the decoder circuit based on signals indicating a function is occurring and indication by the voltage verification circuit that the voltage is within the predetermined range.

21. The system of claim 17, wherein the function comprises one of a read mode and a write mode.

22. The system of claim 17, wherein the wordlines are electrically connected with a plurality of core memory cells.

23. The system of claim 17, wherein the function further comprises one of an erase verify and a program verify.

24. The system of claim 23, wherein the wordlines are reference wordlines electrically connected with a plurality of reference memory cells.

25. The system of claim 23, wherein the voltage comprises one of a supply voltage, an erase verify voltage, a program verify voltage and a program voltage.

26. The system of claim 17, wherein the memory device comprises a flash memory.

* * * * *